(12) United States Patent  
Halpin et al.

(10) Patent No.: US 6,203,622 B1  
(45) Date of Patent: *Mar. 20, 2001

(54) WAFER SUPPORT SYSTEM

(75) Inventors: Michael W. Halpin, Phoenix; Mark R. Hawkins, Gilbert; Derrick W. Foster, Scottsdale; Robert M. Vyne, Tempe; John F. Wengert, Phoenix; Cornelius A. van der Jeugd, Tempe; Loren R. Jacobs, Mesa, all of AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/480,918

(22) Filed: Jan. 11, 2000

Related U.S. Application Data

(63) Continuation of application No. 08/706,069, filed on Aug. 30, 1996.
(60) Provisional application No. 60/003,132, filed on Sep. 1, 1995.

(51) Int. Cl.[7] .................................................. C23C 16/00
(52) U.S. Cl. .......................... 118/730; 118/715; 118/725; 118/728; 118/500
(58) Field of Search ..................................... 118/715, 725, 118/728, 730, 500

(56) References Cited

U.S. PATENT DOCUMENTS

| | | | |
|---|---|---|---|
| 3,304,908 | 2/1967 | Gutsche et al. | 118/725 |
| 3,627,590 | 12/1971 | Mammel | 148/1.5 |
| 4,261,762 | 4/1981 | King | 148/1.5 |
| 4,313,783 | 2/1982 | Davies et al. | 156/643 |
| 4,403,567 | 9/1983 | daCosta et al. | 118/500 |
| 4,457,359 | 7/1984 | Holden | 165/80 C |
| 4,458,746 | 7/1984 | Holden et al. | 165/80 A |
| 4,508,161 | 4/1985 | Holden | 165/1 |
| 4,512,391 | 4/1985 | Harra | 165/48 R |
| 4,522,697 | 6/1985 | Dimock et al. | 204/298 |
| 4,523,985 | 6/1985 | Dimock | 204/298 |

(List continued on next page.)

FOREIGN PATENT DOCUMENTS

| | | |
|---|---|---|
| 0448346A1 | 9/1991 | (EP) . |
| 0452779A2 | 10/1991 | (EP) . |
| 0592017A2 | 4/1994 | (EP) . |
| 0657918A2 | 6/1995 | (EP) . |
| 2181458A | 4/1987 | (GB) . |
| WO 97/09737 | 3/1997 | (JP) . |

Primary Examiner—Jeffrie R. Lund
(74) Attorney, Agent, or Firm—Knobbe, Martens, Olson & Bear, LLP

(57) ABSTRACT

A wafer support system comprising a segmented susceptor having top and bottom sections and gas flow passages therethrough. A plurality of spacers projecting from a recess formed in the top section of the susceptor support wafers in spaced relationship with respect to the recess. A sweep gas is introduced to the bottom section of the segmented susceptor and travels through the gas flow passages to exit in at least one circular array of outlets in the recess and underneath the spaced wafer. The sweep gas travels radially outward between the susceptor and wafer to prevent backside contamination of the wafer. The gas is delivered through a hollow drive shaft and into a multi-armed susceptor support underneath the susceptor. The susceptor support arms are hollow and conduct the sweep gas from the drive shaft to the gas passages in the segmented susceptor. The gas passages within the segmented susceptor are arranged to provide even heat distribution from the sweep gas prior to delivery underneath the wafer. Short purge channels may be provided to deliver some of the sweep gas to regions surrounding the spacers to cause a continuous flow of protective purge gas around the spacers. A common bottom section may cooperate with a plurality of different top sections to form segmented susceptors suitable for supporting various sized wafers.

34 Claims, 11 Drawing Sheets

U.S. PATENT DOCUMENTS

| | | | |
|---|---|---|---|
| 4,527,620 | 7/1985 | Pedersen et al. | 165/80 D |
| 4,535,834 | 8/1985 | Turner | 165/80 R |
| 4,535,835 | 8/1985 | Holden | 165/80 R |
| 4,537,244 | 8/1985 | Holden | 165/1 |
| 4,542,298 | 9/1985 | Holden | 250/443.1 |
| 4,565,601 | 1/1986 | Kakehi et al. | 156/643 |
| 4,567,938 | 2/1986 | Turner | 165/1 |
| 4,603,466 | 8/1986 | Morley | 29/569 R |
| 4,654,509 | 3/1987 | Robinson et al. | 219/405 |
| 4,709,655 | 12/1987 | Van Mastrigt | 118/719 |
| 4,724,621 | 2/1988 | Hobson et al. | 34/218 |
| 4,790,262 | 12/1988 | Nakayama et al. | 118/52 |
| 4,860,687 | 8/1989 | Frijlink | 118/500 |
| 4,911,812 | 3/1990 | Kudo et al. | 204/192.32 |
| 4,923,584 | 5/1990 | Bramhall, Jr. et al. | 204/298.25 |
| 4,949,783 | 8/1990 | Lakios et al. | 165/80.1 |
| 4,958,061 | 9/1990 | Wakabayashi et al. | 219/411 |
| 5,027,746 | 7/1991 | Frijlink | 118/724 |
| 5,033,407 | 7/1991 | Mizuno et al. | 118/725 |
| 5,033,538 | 7/1991 | Wagner et al. | 165/80.1 |
| 5,044,943 | 9/1991 | Bowman et al. | 432/121 |
| 5,090,900 | 2/1992 | Rudolf et al. | 432/239 |
| 5,096,536 | 3/1992 | Cathey, Jr. | 156/643 |
| 5,108,792 | 4/1992 | Anderson et al. | 427/248.1 |
| 5,133,284 | 7/1992 | Thomas et al. | 118/719 |
| 5,155,062 | 10/1992 | Coleman | 437/100 |
| 5,156,820 | 10/1992 | Wong et al. | 422/186.05 |
| 5,160,544 | 11/1992 | Garg et al. | 118/724 |
| 5,179,677 | 1/1993 | Anderson et al. | 392/411 |
| 5,180,000 | 1/1993 | Wagner et al. | 165/80.1 |
| 5,199,483 | 4/1993 | Bahng | 165/1 |
| 5,215,619 | 6/1993 | Cheng et al. | 156/345 |
| 5,221,403 | 6/1993 | Nozawa et al. | 156/345 |
| 5,230,741 | 7/1993 | van de Ven et al. | 118/728 |
| 5,238,499 | 8/1993 | van de Ven et al. | 118/724 |
| 5,248,370 | 9/1993 | Tsui et al. | 156/345 |
| 5,267,607 | 12/1993 | Wada | 165/80.1 |
| 5,287,914 | 2/1994 | Hughes | 165/80.1 |
| 5,290,381 | 3/1994 | Nozawa et al. | 156/345 |
| 5,292,393 | 3/1994 | Maydan et al. | 156/345 |
| 5,298,465 | 3/1994 | Levy | 437/225 |
| 5,306,699 | 4/1994 | Eddy | 422/245 |
| 5,308,645 | 5/1994 | Zachman et al. | 427/97 |
| 5,318,634 | 6/1994 | deBoer et al. | 118/730 |
| 5,320,982 | 6/1994 | Tsubone et al. | 437/228 |
| 5,322,565 | 6/1994 | Zachman et al. | 118/500 |
| 5,332,442 | 7/1994 | Kubodera et al. | 118/725 |
| 5,343,012 | 8/1994 | Hardy et al. | 219/443 |
| 5,343,938 | 9/1994 | Schmidt | 165/80.2 |
| 5,350,479 | 9/1994 | Collins et al. | 156/345 |
| 5,352,294 | 10/1994 | White et al. | 118/725 |
| 5,354,382 | 10/1994 | Sung et al. | 118/723 MR |
| 5,356,476 | 10/1994 | Foster et al. | 118/725 |
| 5,370,739 | 12/1994 | Foster et al. | 118/725 |
| 5,382,311 | 1/1995 | Ishikawa et al. | 156/345 |
| 5,383,971 | 1/1995 | Selbrede | 118/728 |
| 5,387,289 | 2/1995 | Schmitz et al. | 118/725 |
| 5,393,349 | 2/1995 | Ohkase | 118/725 |
| 5,403,401 | 4/1995 | Haafkens et al. | 118/728 |
| 5,445,677 | 8/1995 | Kawata et al. | 118/724 |
| 5,446,824 | 8/1995 | Moslehi | 392/416 |
| 5,456,757 | 10/1995 | Aruga et al. | 118/723 E |
| 5,458,687 | 10/1995 | Shichida et al. | 118/724 |
| 5,462,603 | 10/1995 | Murakami | 118/719 |
| 5,467,220 | 11/1995 | Xu | 359/350 |
| 5,492,566 | 2/1996 | Sumnitsch | 118/500 |
| 5,522,131 | 6/1996 | Steger | 29/829 |
| 5,645,646 | 7/1997 | Beinglass et al. | 118/730 |
| 5,650,082 | 7/1997 | Anderson | 219/390 |
| 5,656,093 | 8/1997 | Burkhart et al. | 118/728 |
| 5,683,518 | 11/1997 | Moore et al. | 118/730 |
| 5,685,906 | 11/1997 | Dietze et al. | 117/101 |
| 5,700,725 | 12/1997 | Hower et al. | 437/225 |
| 5,738,165 | 4/1998 | Imai | 165/80.2 |
| 5,951,775 | 9/1999 | Tepman | 118/729 |
| 6,053,982 * | 4/2000 | Halpin et al. | 118/728 |

* cited by examiner

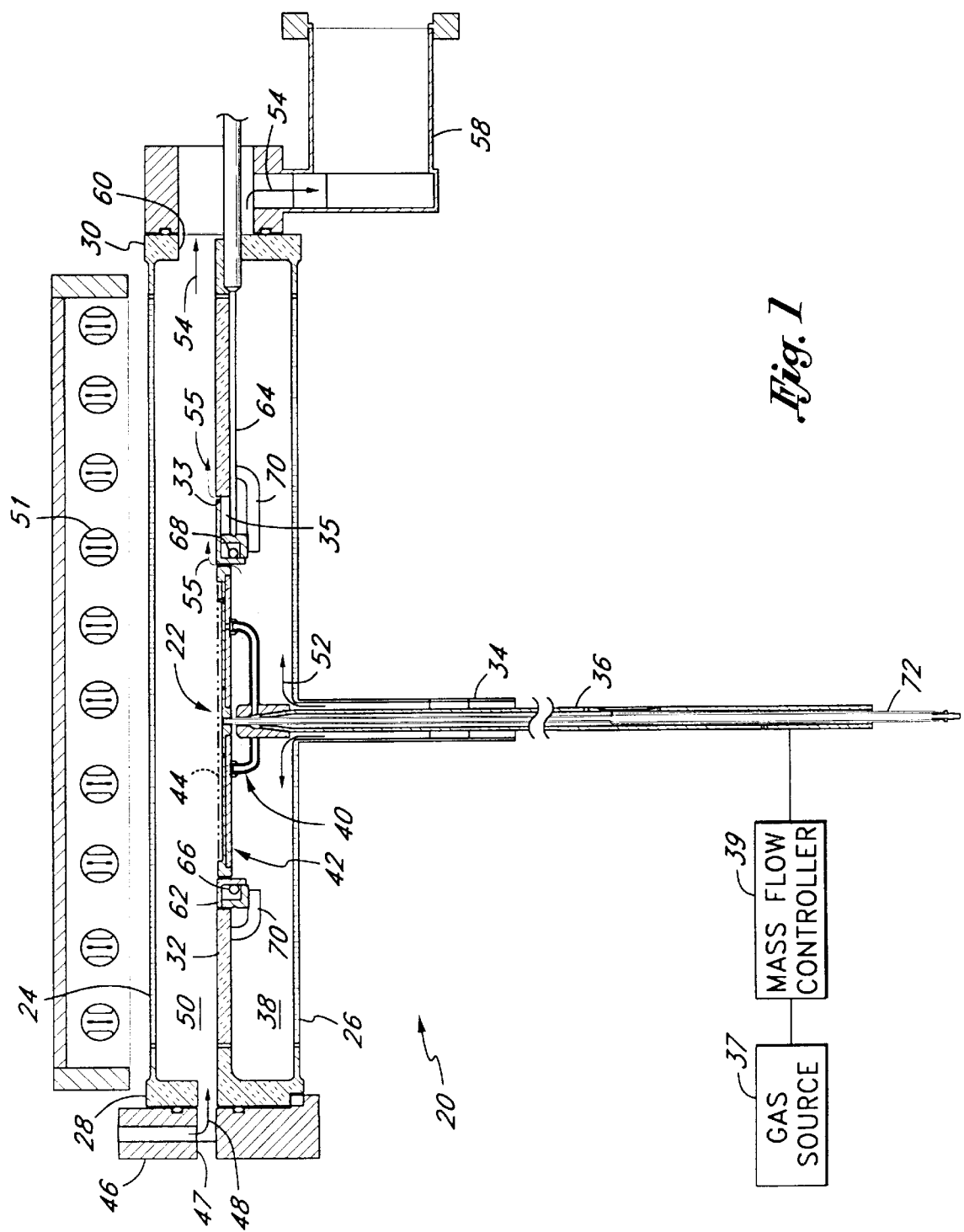

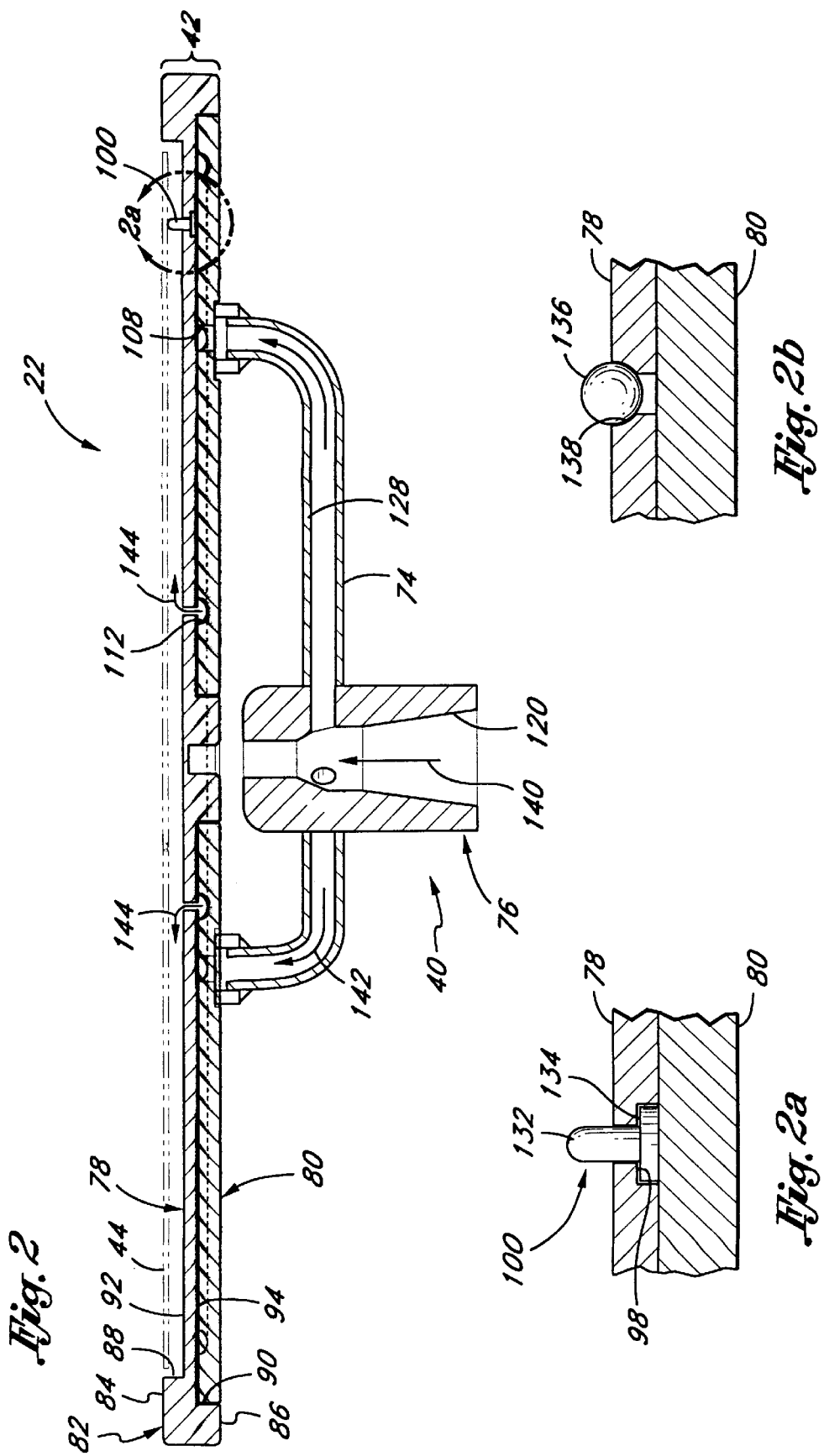

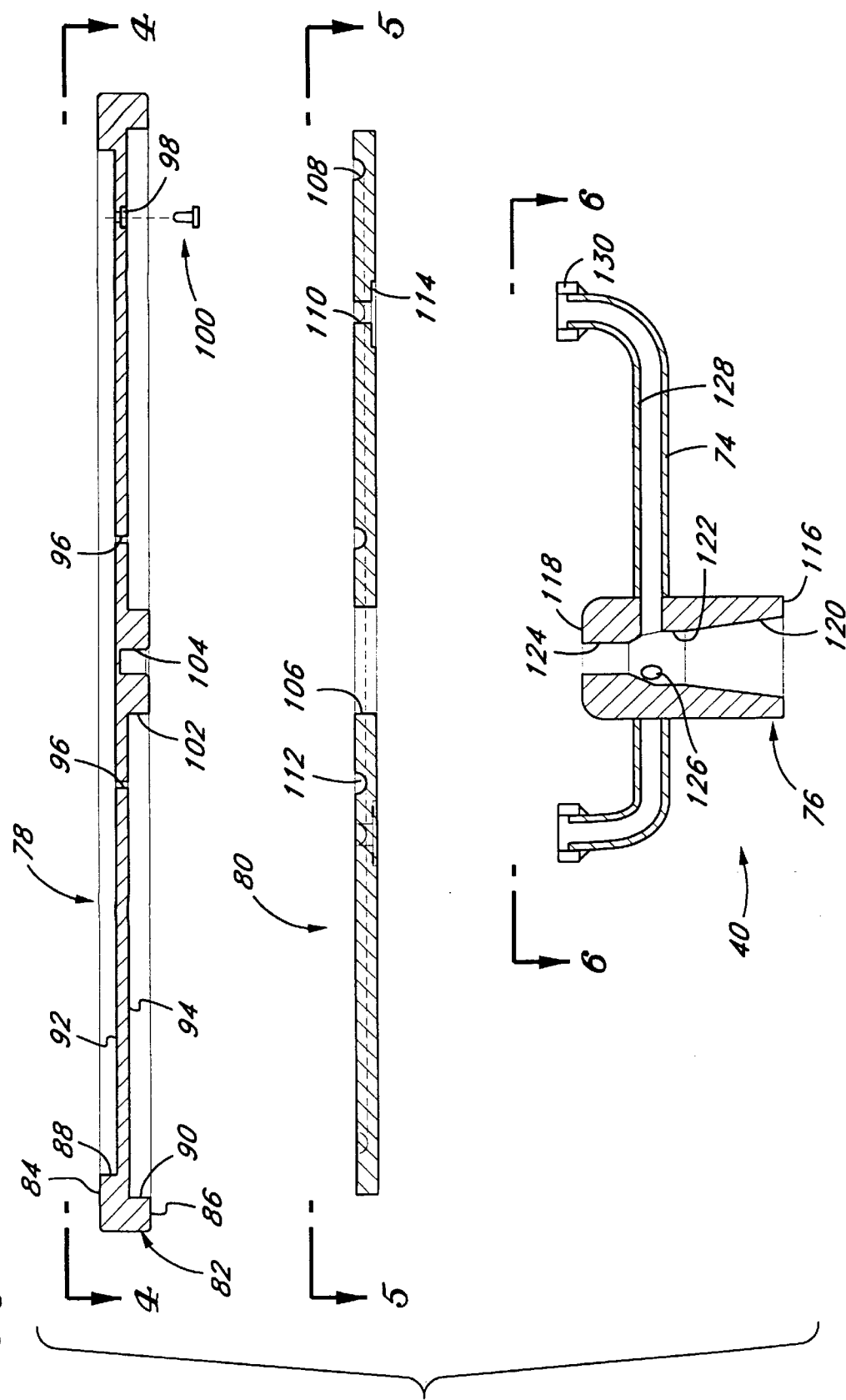

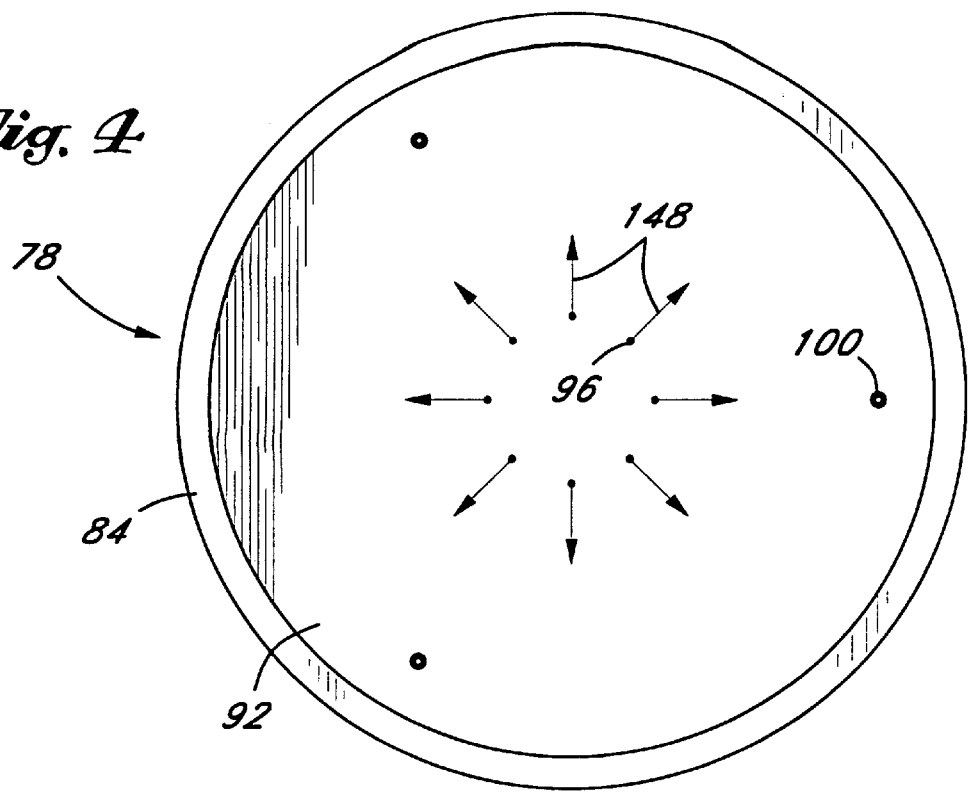
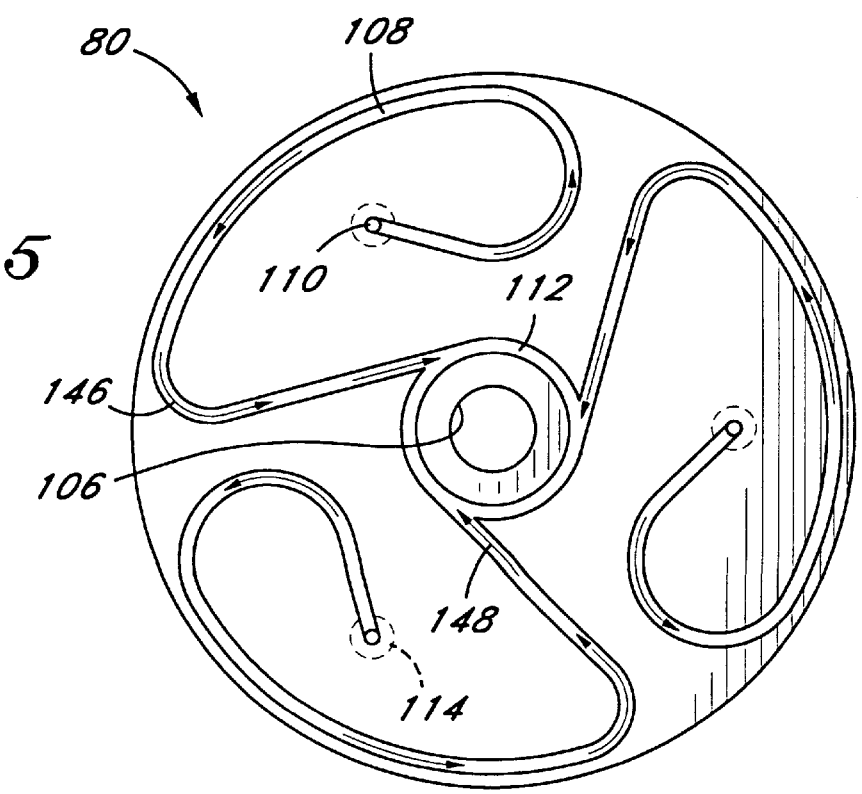

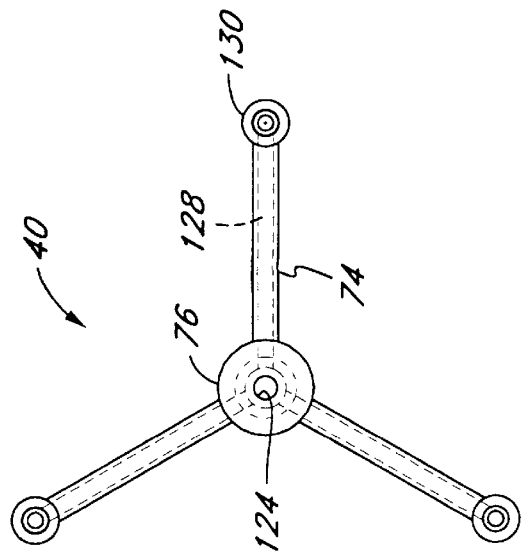
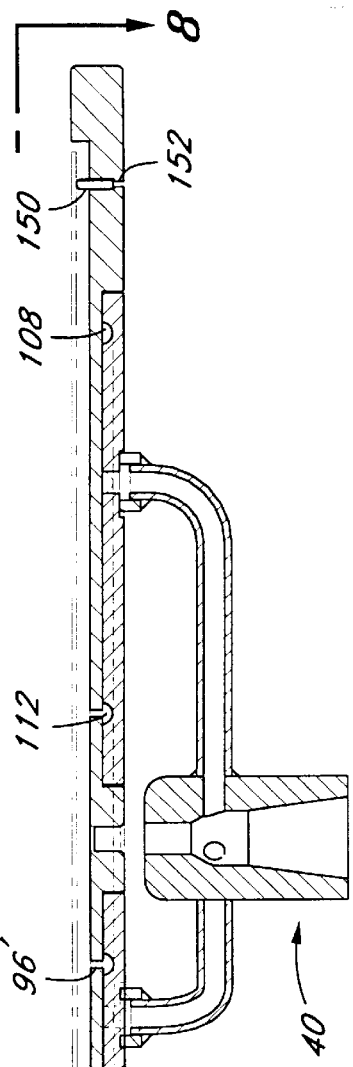
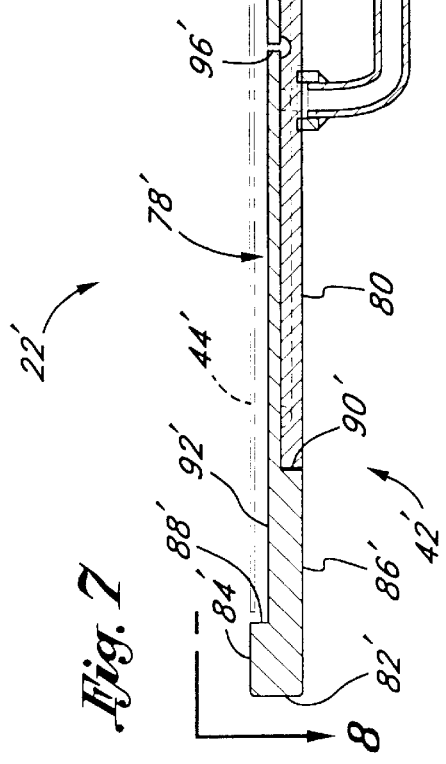

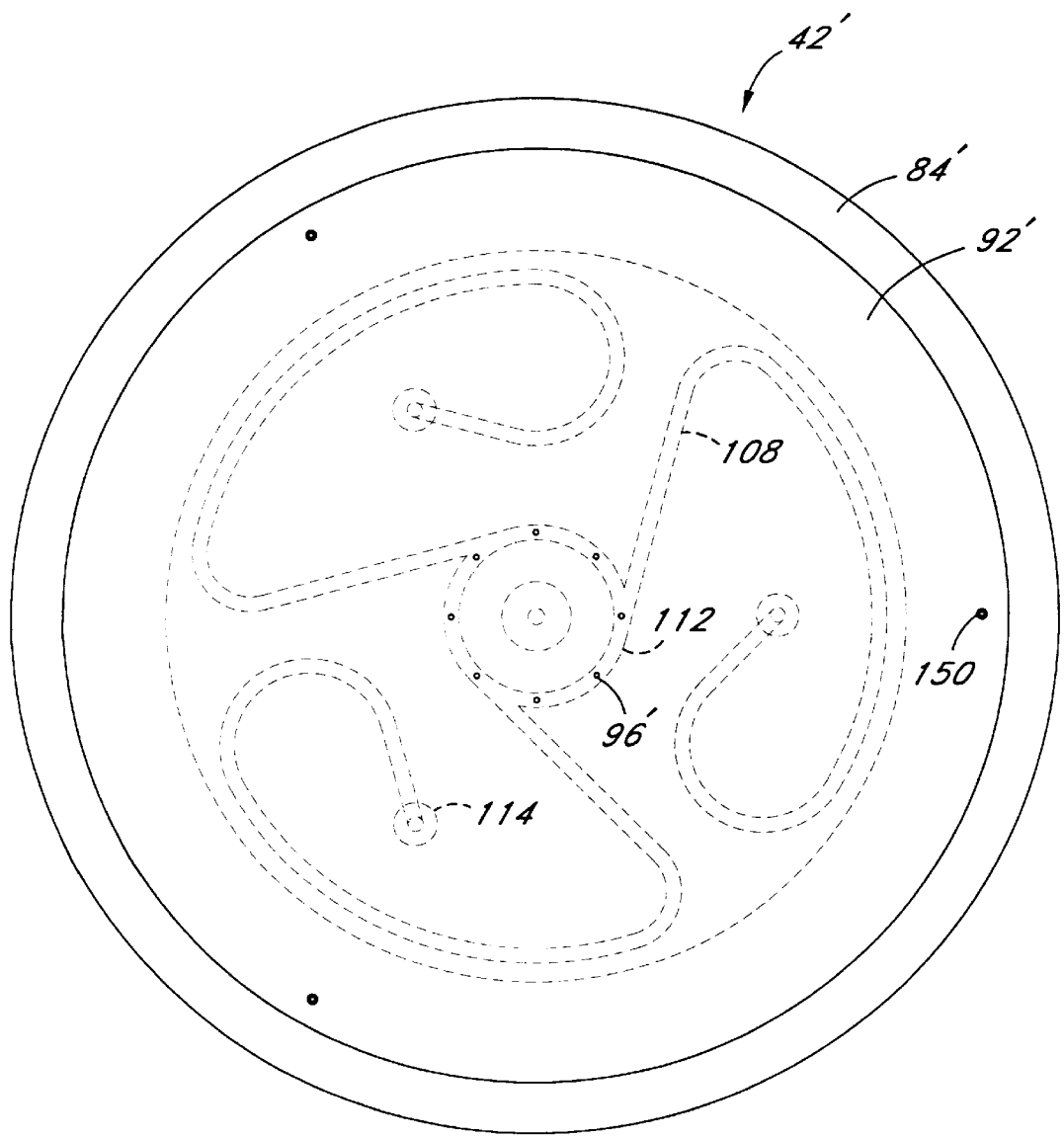

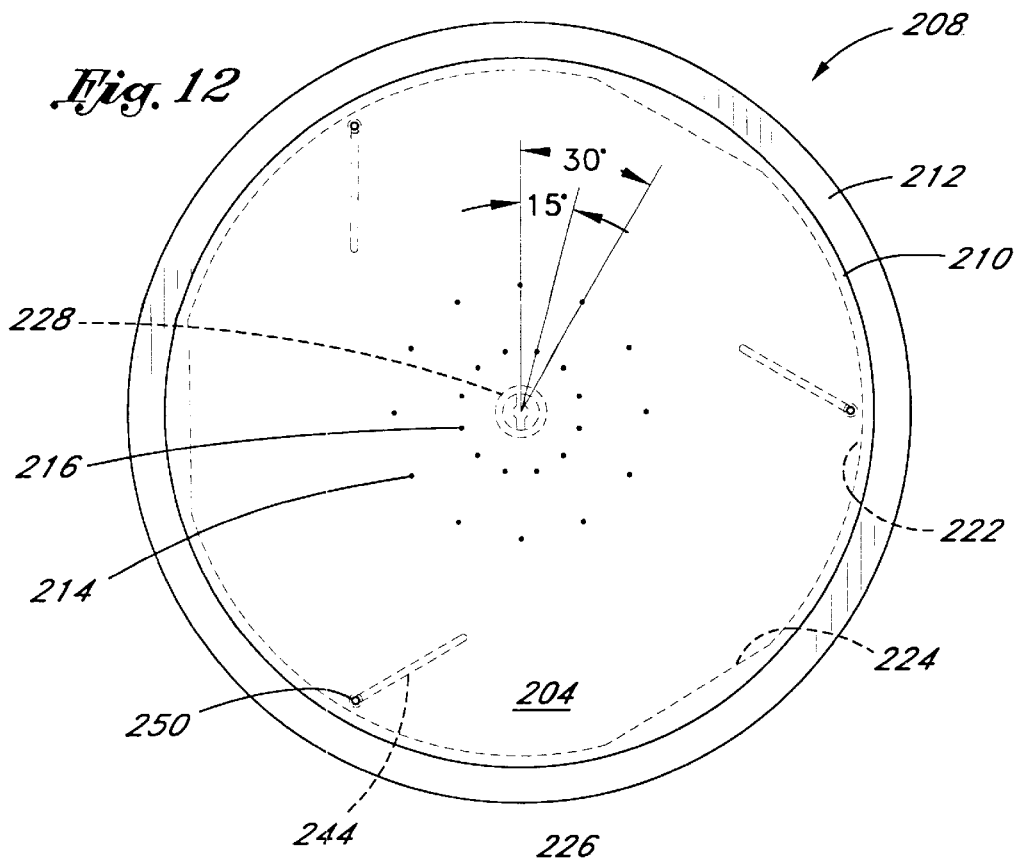
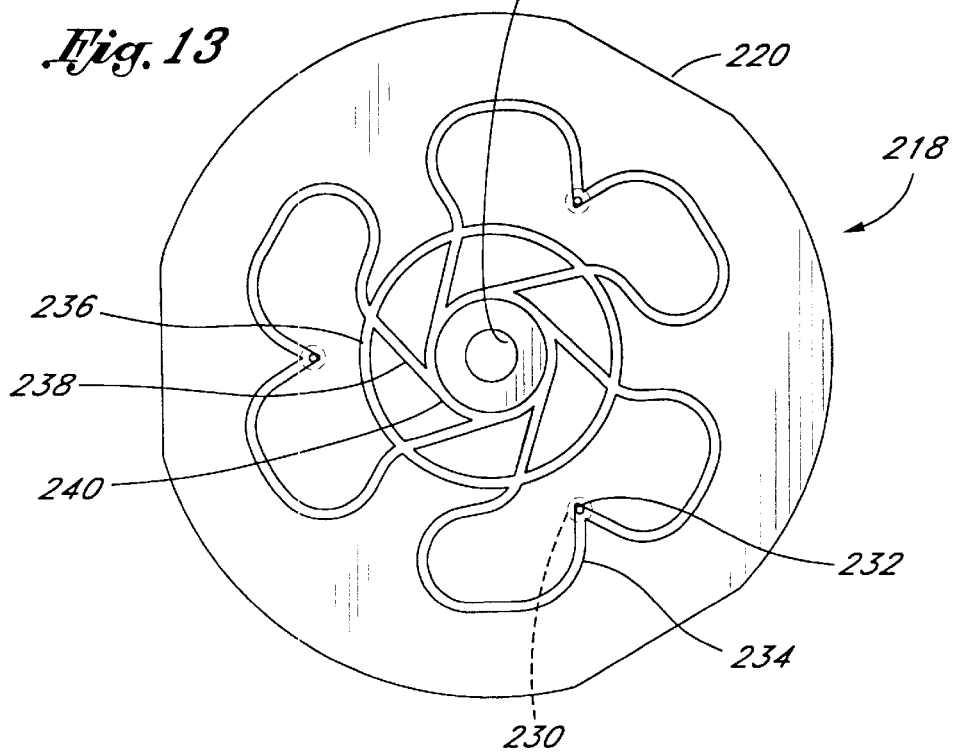

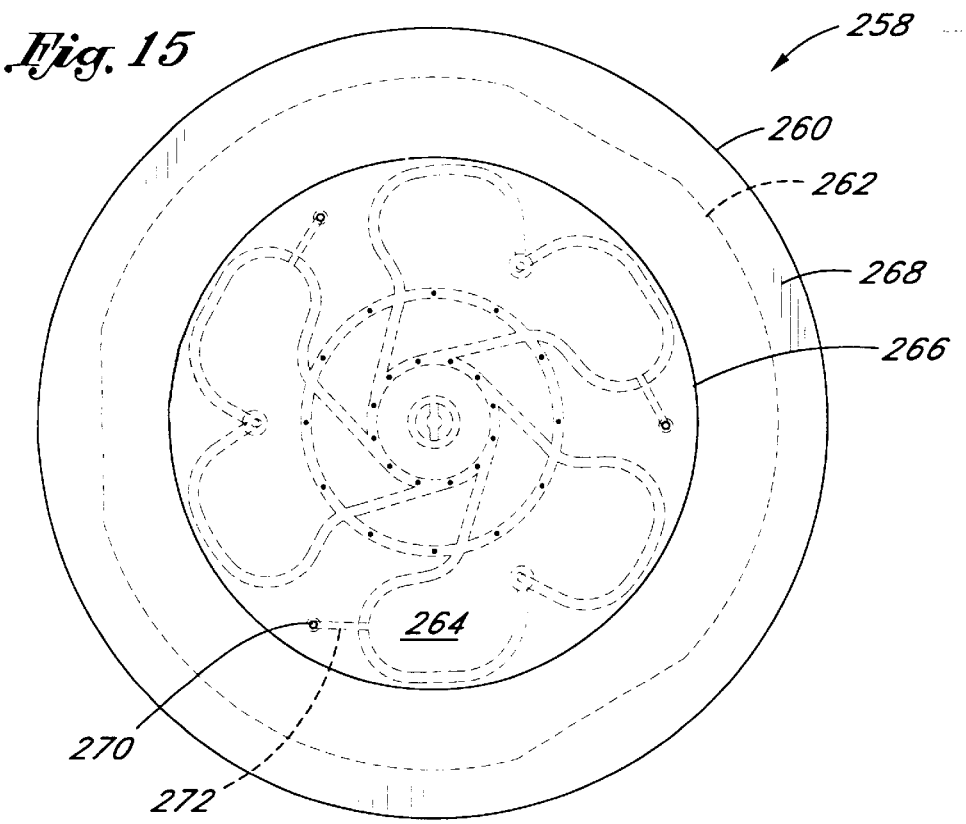
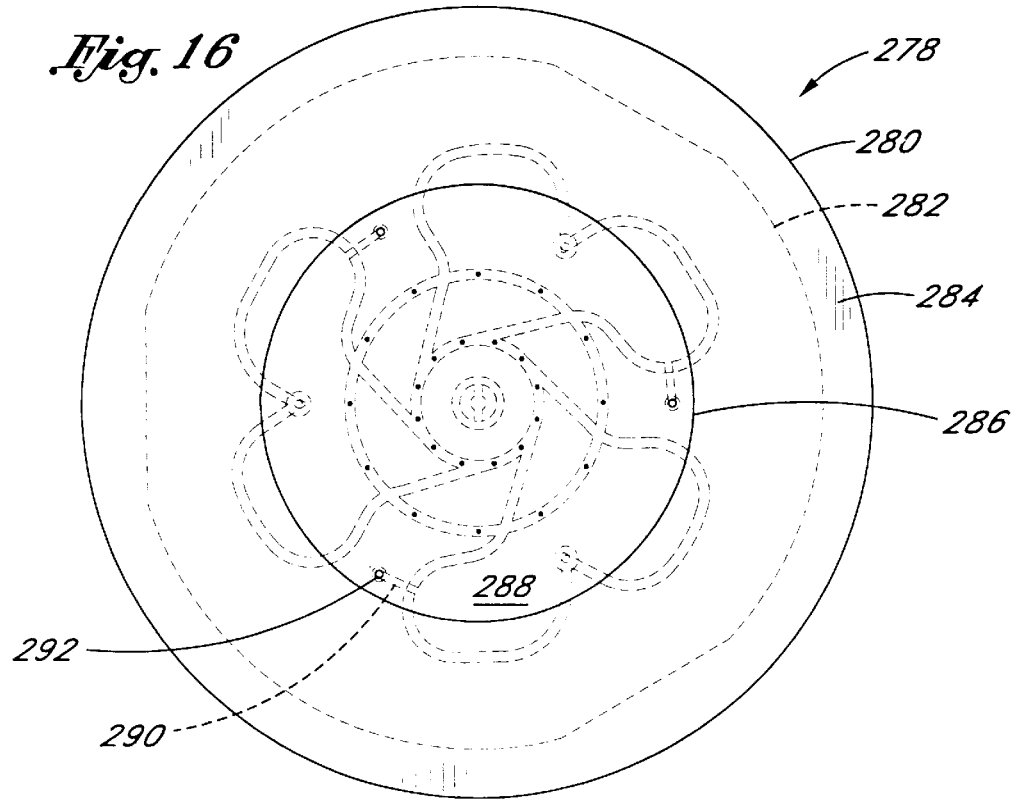

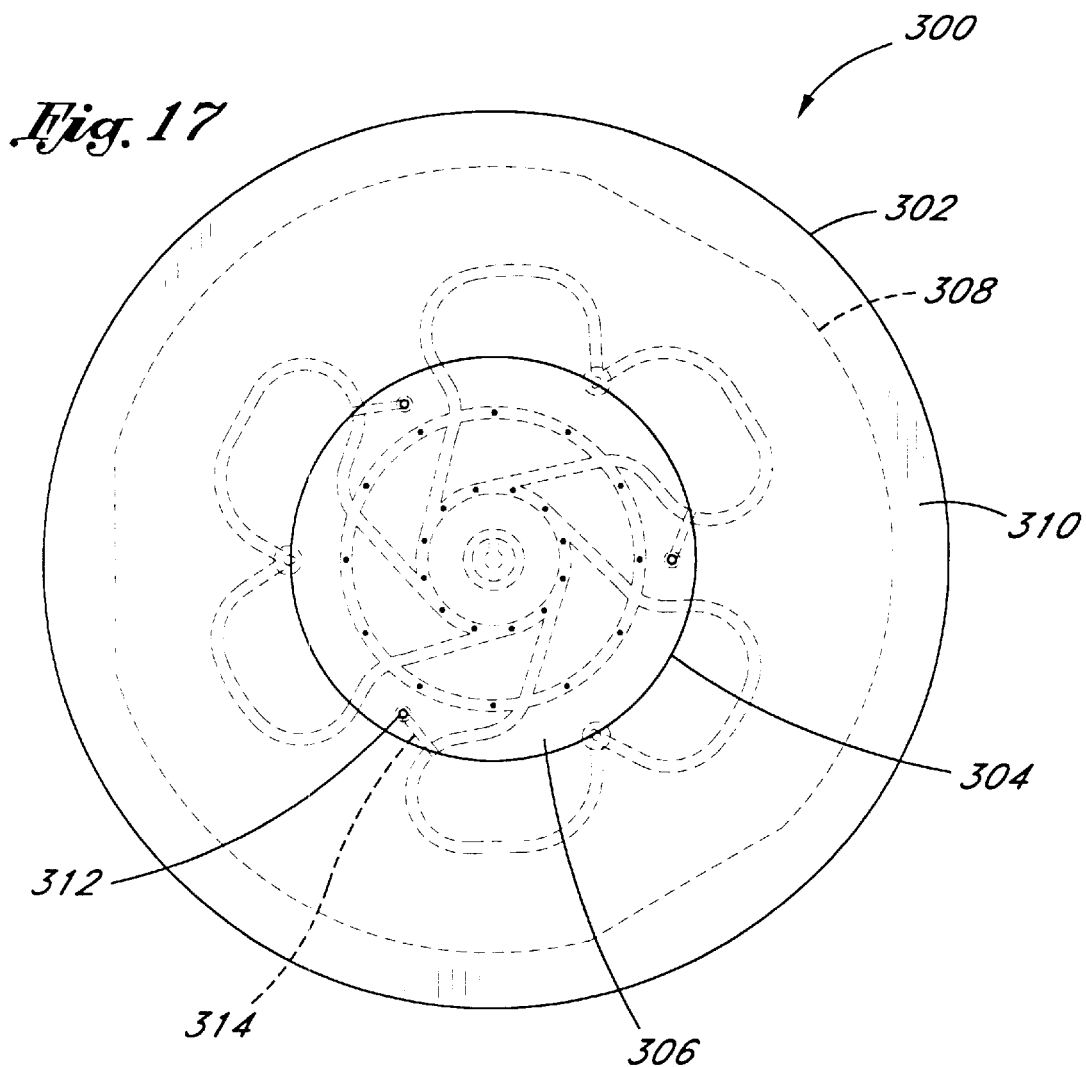

WAFER SUPPORT SYSTEM

REFERENCE TO RELATED APPLICATION

The present application is a continuation of U.S. application Ser. No. 08/706,069, filed Aug. 30, 1996, now U.S. Pat. No. 6,053,982.

RELATED APPLICATION

Pursuant to 35 U.S.C. § 119(e), this application claims the priority benefit of Provisional Application No. 60/003,132, filed Sep. 1, 1995.

FIELD OF THE INVENTION

The present invention relates to supports for wafers in semiconductor processing chambers and, more particularly, to a system for supporting a wafer above a susceptor within a chemical vapor deposition chamber.

BACKGROUND OF THE INVENTION

High-temperature ovens, or reactors, are used to process semiconductor wafers from which integrated circuits are made for the electronics industry. A circular wafer or substrate, typically made of silicon, is placed on a wafer support called a susceptor. Both the wafer and susceptor are enclosed in a quartz chamber and heated to high temperatures, such as 600° C. (1112° F.) or higher, frequently by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits.

If the deposited layer has the same crystallographic structure as the underlying silicon wafer, it is called an epitaxial layer. This is also sometimes called a monocrystalline layer because it has only one crystal structure.

Various CVD process parameters must be carefully controlled to ensure the high quality of the resulting semiconductor. One such critical parameter is the temperature of the wafer during the processing. The deposition gas reacts at particular temperatures and deposits on the wafer. If the temperature varies greatly across the surface of the wafer, uneven deposition of the reactant gas occurs.

In certain batch processors (i.e., CVD reactors which process more than one wafer at a time) wafers are placed on a relatively large-mass susceptor made of graphite or other heat-absorbing material to help the temperature of the wafers remain uniform. In this context, a "large-mass" susceptor is one which has a large thermal mass relative to the wafer. The thermal mass is directly related to its mass, which is equal to the density times volume and to its specific heat.

One example of a large-mass susceptor is shown in U.S. Pat. No. 4,496,609 issued to McNeilly, which discloses a CVD process wherein the wafers are placed directly on a relatively large-mass, slab-like susceptor and maintained in intimate contact to permit a transfer of heat therebetween. The graphite susceptor supposedly acts as a heat "flywheel" which transfers heat to the wafer to maintain its temperature uniform. The goal is to reduce transient temperature variations around the wafer that would occur without the "flywheel" effect of the susceptor.

Although large-mass susceptors theoretically increase temperature uniformity across the wafers, the large thermal mass of the susceptor necessarily slows its response to temperature transients, resulting in instances where the temperatures of the susceptor and wafer differ. This is highly undesirable because during temperature transients, the wafer temperature does not correspond to the temperature of the susceptor, and the process becomes difficult to control. Temperature, and thus deposition, nonuniformities may occur across the wafer surface during these transients.

In recent years, single-wafer processing of larger diameter wafers has grown for a variety of reasons including its greater precision as opposed to processing batches of wafers at the same time. Although single-wafer processing by itself provides advantages over batch processing, control of process parameters and throughput remains critical. In systems in which the wafer is supported in intimate contact with a large-mass susceptor, the temperature responses of the two elements diverge during heat-up and cool-down cycles; the wafer responding more rapidly given its smaller thermal mass. Not only do temperature differences create a risk of temperature and deposition nonuniformity on the wafer, the process throughput is limited by the time it takes for the susceptor to heat up and cool down.

Another significant problem faced when attempting to obtain high-quality CVD films is particulate contamination. One troublesome source of particulates in the CVD of metals and other conductors is the film that forms on the back side of the wafer under certain conditions. For example, if the wafer back side is unprotected or inadequately protected during deposition, a partial coating of the CVD material forms thereon. This partial coating tends to peel and flake easily for some types of materials, introducing particulates into the chamber during deposition and subsequent handling steps. One example of protecting the back side of a wafer during processing is given in U.S. Pat. No. 5,238,499 to van de Ven, et al. In this patent an inert gas is introduced through a circular groove in the peripheral region of a support platen. In U.S. Pat. No. 5,356,476 to Foster, et al., a semiconductor wafer processing apparatus is shown, including a plurality of ducts for introducing helium or hydrogen around the perimeter of a wafer to prevent flow of reactant gases downwardly into a gap between the perimeter of the wafer and a wafer support lip. The aforementioned devices, however, share the feature of rather large wafer support platens, characterized by the aforementioned detrimental high thermal mass.

Presently, there is a need for an improved wafer support to increase throughput of semiconductor processing devices while ensuring temperature uniformity across the wafer surface.

SUMMARY OF THE INVENTION

The present invention embodies a susceptor which supports a wafer spaced therefrom and effectively decouples conductive heat transfer between the two elements. Wafers are supported on spacers over a recess in an upper surface of the susceptor, the top plane of the wafers being approximately on level with an outer ledge of the susceptor. The susceptor preferably includes a plurality of interior passages opening into the recess at a plurality of small sweep gas holes. A sweep gas flows through the susceptor and out the holes and protects the back side of the wafer from particulate contamination. In one embodiment, the susceptor is formed by top and bottom mating sections and the internal passages are formed by grooves in one of the juxtaposed surfaces of the two sections. Desirably, a multi-armed member supports and rotates the susceptor, the member preferably being substantially transparent to radiant energy. The arms of the support member may be hollow and deliver sweep gas to the lower surface of the susceptor at apertures in communication with the internal passages. Some of the sweep gas may be diverted to exit the susceptor proximate the spacers to provide sweep gas protection therearound at all times.

In one aspect, the invention provides a susceptor to be positioned in a high temperature processing chamber for supporting a wafer to be processed. The susceptor includes a thin, substantially disc shaped lower section and a thin, substantially disc shaped upper section having a lower surface in engagement with an upper surface of said lower section. One of the sections has an outer diameter larger than that of the other section, the larger section having a recess in which the other section is positioned. One or more gas channels are defined by the engaging surfaces of the sections. The susceptor includes one or more gas inlets in the lower section opening to its lower surface and the channels. One or more gas outlets in the upper section open to the upper surface of the upper section in an area beneath that in which a wafer to be processed is to be positioned. The mating recess is preferably formed in a lower surface of the upper section. In one form, the channels are formed by grooves in the upper surface of the lower section with the grooves being closed by the lower surface of the upper section. There are preferably three of the inlets each opening to the channels, the channels being interconnected to allow gas flow throughout.

In accordance with another aspect, the invention provides an apparatus for chemical vapor deposition on a semiconductor wafer comprising a deposition chamber having a process gas inlet for injecting process gases into the chamber. A single susceptor is provided in the chamber for supporting a semiconductor wafer. A support for the susceptor includes a central shaft positioned below the susceptor axis and a plurality of support arms extending radially and upwardly from the shaft with the arms having upper ends adapted to engage the lower surface and support the susceptor. One or more of the arms are tubular and in registry with inlets in the susceptor so that gas may be conducted through the tubular arms into the inlets.

The present invention also provides a method of supporting a semiconductor wafer in a processing chamber and conducting gas flow beneath the wafer. The method comprises the steps of positioning the wafer on a plurality of spacers protruding upwardly from an upper surface of the susceptor to support the wafer and form a gap between the wafer and the upper surface of the susceptor. The susceptor is supported on a plurality of arms having upper ends engaging a lower surface of the susceptor. Gas flows through one or more of the arms into passages in the susceptor which open to the gap. The gas is allowed to flow outwardly beyond the periphery of the wafer. Desirably, the spacers are positioned in apertures in the susceptor, and some of the gas flows from the arms through the susceptor passages and into the gap via the apertures surrounding the spacers.

In another aspect, an apparatus for supporting wafers in a semiconductor processing environment, in accordance with the invention includes a disk-shaped lower section and a plurality of disk-shaped upper sections each adapted to register concentrically with the lower section. The upper sections each have a shallow wafer recess sized differently than the other upper sections to enable selection of the upper section depending on the size of wafer to be processed. The apparatus preferably includes at least two upper sections for processing wafers having diameters greater than 100 mm, and more preferably also includes an upper section for processing a wafer having a diameter of 100 mm.

BRIEF DESCRIPTION OF THE DRAWINGS

FIG. 1 is a cross-sectional view along the longer of two horizontal axes through a reactor chamber incorporating an improved wafer support system of the present invention;

FIG. 2 is a cross-sectional view through one embodiment of a wafer support system of the present invention;

FIG. 2a is a detailed view of one embodiment of a wafer spacer in the form of a pin;

FIG. 2b is a detailed view of an alternative wafer spacer in the form of a sphere;

FIG. 3 is an exploded view of the wafer support system illustrated in FIG. 2;

FIG. 4 is a top plan view of an upper section of a segmented susceptor of the wafer support system taken along line 4—4 of FIG. 3;

FIG. 5 is a top plan view of a lower section of the segmented susceptor taken along line 5—5 of FIG. 3;

FIG. 6 is a top plan view of a susceptor support for use in the wafer support system of the present invention, taken along line 6—6 of FIG. 3;

FIG. 7 is a cross-sectional view of another wafer support system according to the present invention;

FIG. 8 is a top plan view of a segmented susceptor for use in the wafer support system of FIG. 7, taken along line 8—8;

FIG. 12 is a top plan view of a first version of a top section of a segmented susceptor for use in the wafer support system of FIG. 11;

FIG. 13 is a top plan view of a bottom section of the segmented susceptor of the wafer support system of FIG. 11;

FIG. 15 is a top plan view of a second version of the top section of the segmented susceptor for use in the wafer support system of FIG. 11;

FIG. 16 is a top plan view of a third version of the top section of the segmented susceptor for use in the wafer support system of FIG. 11; and FIG. 17 is a top plan view of a fourth version of the top section of the segmented susceptor for use in the wafer support system of FIG. 11.

DETAILED DESCRIPTION OF THE PREFERRED EMBODIMENTS

Figure 9:
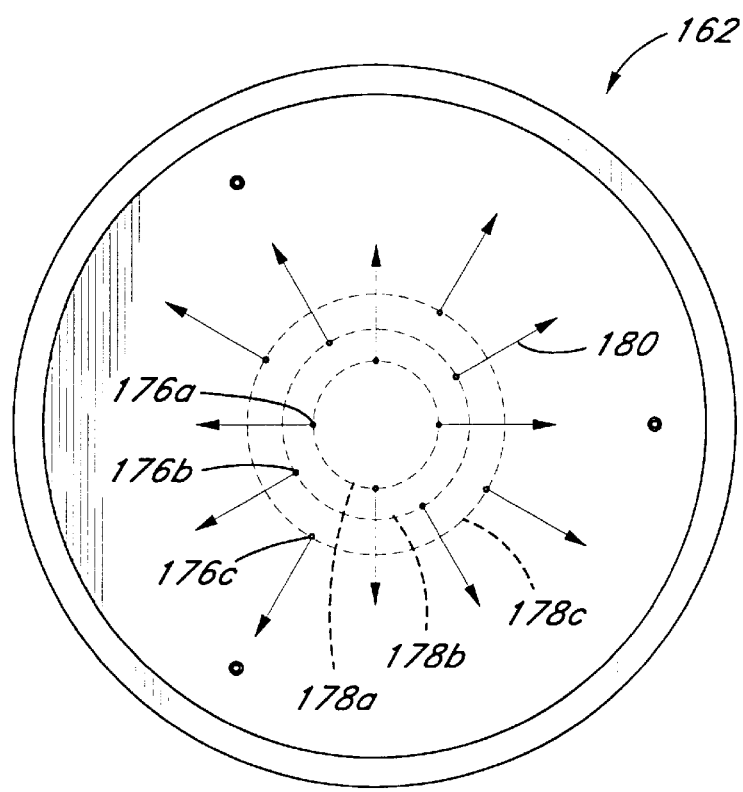
FIG. 9 is a top plan view of an alternative upper section of a segmented susceptor having gas outlets distributed around concentric circles.

FIG. 1 illustrates a reactor chamber 20 for processing semiconductor wafers, within which a wafer support system 22 of the present invention is incorporated. Prior to discussing the details of the wafer support system 22, the elements of the reaction chamber 20 will be described. Although the support system 22 is preferably incorporated into the reaction chamber 20 shown, the support system is suitable for many types of wafer processing systems, and the discussion herein should not be limited to one particular type of reaction chamber.

The chamber 20 comprises a quartz tube defined by an upper wall 24, a lower wall 26, an upstream flange 28, and a downstream flange 30. Although not shown in the figure, the walls have a concave inner surface and a convex outer surface which, when viewed from a lateral cross-section, has a lenticular shape; and lateral edges of the reaction chamber 20 include relatively thick side rails between which a chamber support plate 32 is attached. FIG. 1 is a longitudinal cross-section along a central vertical plane of the chamber 20 illustrating the vertical dimension of the lenticular shape; the side rails are thus not seen. Preferably, the chamber 20 is manufactured from quartz. The chamber support plate 32 reinforces the chamber 20 during vacuum processing and extends between the side rails (not shown), preferably along the center line of the chamber 20. The support plate 32 includes an aperture 33 defining a void or opening 35 extending across the lateral dimension of the chamber 20 between the side rails. The aperture 33 divides the support plate 32 into an upstream section extending from the upstream flange 28 to an upstream edge of the aperture, and a downstream section extending from a downstream of the aperture to the downstream flange 30. The upstream section of the support plate 32 is preferably shorter in the longitudinal direction than the downstream section.

An elongated tube 34 depends from a centrally located region of the lower wall 26. A drive shaft 36 extends through the tube 34 and into a lower region 38 of the chamber 20. The lower region 38 is defined between the central chamber support plate 32 and the lower wall 26. The upper end of the drive shaft 36 is tapered to fit within a recess of a multi-armed support or spider assembly 40 for rotating a segmented susceptor 42. The susceptor 42 supports a wafer 44, shown in phantom. A motor (not shown) drives the shaft 36 to, in turn, rotate the wafer support system 22 and wafer 44 thereon within the aperture 33. A gas injector 46 introduces process gas, as indicated by arrow 48, into an upper region 50 of the chamber 20. The upper region 50 is defined between the upper wall 24 and the chamber support plate 32. The process gas passes over the top surface of the wafer 44 to deposit chemicals thereon. The system typically includes a plurality of radiant heat lamps arrayed around the outside of the reaction chamber 20 for heating the wafer 44 and catalyzing the chemical deposition thereon. An upper bank of elongated heat lamps 51 is illustrated outside of the upper wall 24, and typically a lower bank of lamps arranged cross-wise to the upper bank is also utilized. Further, a concentrated array of lamps directed upward from underneath the susceptor 42 is often used.

A source of sweep gas 37 is schematically shown connected through a mass flow controller 39 to the drive shaft 36. Gas flows into the space within the hollow shaft 36 and is eventually directed upward through the susceptor 42, as will be more fully described below. The fluid coupling allowing gas to the interior of the hollow, rotating shaft 36 is not shown, but may accomplished by a number of means, one of which is shown and described in U.S. Pat. No. 4,821,674, issued Apr. 18, 1989, hereby expressly incorporated by reference.

A wafer is introduced to the reaction chamber 20 through a wafer entry port 47. The wafer is typically transported by a robot pick-up arm (not shown) which enters through the port 47 and extends over the wafer support system 22 to deposit the wafer thereon. The CVD system then seals the reaction chamber 20 and introduces process gas for depositing a layer of silicon or other material on the wafer. After processing, a gate valve opens and the robot pick-up arm enters through the port 47 and retracts the wafer from the susceptor 42. Periodically, the reaction chamber 20 must be conditioned for subsequent processing. A typical sequence is the introduction of an etch gas into the reaction chamber with the gate valve closed to clean any particular deposition from the interior walls. After the etching, a silicon precursor is sometimes introduced into the chamber to provide a thin coat of silicon on the susceptor 42. Such a coating step is sometimes termed capping. After the etching and capping steps, the chamber is purged with hydrogen and heated for introduction of the next wafer.

The tube 34 is sized slightly larger than the drive shaft 36 to provide space therebetween through which purge gas 52 flows. The purge gas enters the lower region 38 of the reaction chamber 20 to help prevent reactant gas from depositing in the lower region. In this respect, the purge gas 52 creates a positive pressure below the wafer support system 22, which helps prevent reactant gas from traveling around the sides of the segment susceptor 42 in the lower region 38. The purge gas is then exhausted, as indicated with arrows 54 and 55, between the susceptor 42 and aperture 33 into the upper region 50 and then through an elongated slot 60 in the downstream flange 30. This ensures reactant gases do not migrate into the lower region 38. The purge gas continues through an exhaust system 58. The reactant gas likewise passes through the elongated slot 60 in the downstream flange 30 to be vented through the exhaust system 58.

Preferably, a temperature compensation ring 62 surrounds the wafer support system 22. The ring 62 fits in the opening 35 created by the aperture 33 in the support plate 32, and the wafer support system 22 and ring substantially fill the opening and provide structure between the lower and upper chamber regions 38, 50. The susceptor 42 rotates within the ring 62 and is preferably spaced therefrom across a small annular gap of between 0.5 and 1.5 millimeters. The shape of the aperture 33 in the support plate 32 surrounding the ring 62 can be made circular so that the edges of the opening 35 are in close proximity to the ring. However, it has been found that a rectangular aperture 33 having rounded corners is preferred. In this respect, the ring 62 may have a rounded rectangular outer periphery, or a second structure may be utilized to fill the gap between the circular ring and the rounded rectangular aperture 33. As will be described in greater detail below, the susceptor 42 is preferably manufactured to have a constant outer diameter to fit within the ring 62, and surrounding aperture 33. Although the susceptor 42 has a constant outer diameter, it will be seen that various configurations are provided for processing a number of different size wafers.

In a particularly advantageous embodiment, the temperature compensation ring 62 comprises a two-part circular ring having a cavity therein for receiving thermocouples 64. In the embodiment shown the thermocouples 64 enter the chamber 20 through apertures formed in the downstream flange 30 and extend underneath the support plate 32 into the temperature compensation ring 62. The apertures in the quartz flange 30 substantially prevent gas leakage around the thermocouples 64, although typically no additional seal is used. There are preferably three such thermocouples, one terminating at a leading edge 66, one terminating at a trailing edge 68, and one terminating at either of the lateral sides of the ring 62. The thermocouples within the ring 62 surrounding the segmented susceptor 42 provide good temperature information feedback for accurate control of the radiant heating lamps. A plurality of bent fingers 70 attached to the support plate 32 support the ring 62 around the periphery of the susceptor 42. In addition to the temperature compensation ring 62 and thermocouples therein, a central thermocouple 72 extends upward through the drive shaft 36, which is constructed hollow, and through the spider assembly 40 to terminate underneath the center of the susceptor 42. The central thermocouple 72 thus provides an accurate gauge of the temperature near the center of the wafer 44.

Now, referring to FIG. 2, a first embodiment of a wafer support system 22 is shown. Again, the system 22 generally comprises the segmented susceptor 42 supported by arms 74 of the spider assembly 40. The arms 74 extend radially outward from a hub 76 and bend vertically upward at predetermined radial distances to contact the underside of the susceptor 42. The segmented susceptor 42 comprises an upper section 78 and a lower section 80, both sections being generally planar disk-shaped elements. Both sections 78, 80 of the susceptor 42 are preferably machined out of graphite and fit closely together without additional fastening means to ensure minimal gas leakage therebetween. A gap of less than 0.001 inch between the adjacent circular surfaces of the upper and lower sections 78, 80 is acceptable for this purpose. A thin coating of silicon carbide may be formed on one or both sections 78, 80. The thickness of the susceptor 42 is about 0.30 inches.

With reference to the exploded view of FIG. 3, the upper section 78 generally comprises an outer ring 82 surrounding a thinner circular middle portion. The outer ring 82 comprises an upper rim or ledge 84 and a lower rim or skirt 86 which terminate at upper and lower shoulders or steps 88, 90, respectively. The upper step 88 forms a transition between the ledge 84 and a circular wafer-receiving recess 92. The lower step 90 forms a transition between the skirt 86 and an annular recess 94 in the underside of the upper section 78. The upper section 78 further includes a circular pattern of sweep gas outlets 96 symmetrically disposed about the central axis of the upper section, and in the recess 92. The recess 92 may have a flat, smooth, ungrooved surface, but may also be roughened to reduce the potential for wafer sticking or floating.

At spaced locations distributed around a circle concentric about the axis of the susceptor 42, a plurality of counter-bored holes 98 are formed proximate the upper step 88. The counter-bored holes 98 include a smaller through hole opening to the circular recess 42 and a larger counterbore concentric with the smaller through hole and opening downwardly to the annular recess 94. Each counter-bored hole 98 is sized to receive a wafer support or spacer 100 which projects into the circular recess 92. The wafer 44 rests on the spacers 100 above the floor of the recess 92. In this respect, the recess 92 is sized to receive a wafer therein so that the edge of the wafer is very close to the step 88. The upper section 78 further includes a downwardly depending central spindle 102 defining a radially inner border of the annular recess 94. A central thermocouple cavity 104 is defined in the spindle 102 for receiving a sensing end of the central thermocouple 72 previously described.

With reference to FIGS. 3 and 5, the annular lower section 80 comprises a central through bore 106 sized to fit around the downwardly depending spindle 102 of the upper section 78. The upper surface of the lower section 80 includes a plurality of gas passage grooves. More specifically, a pattern of curvilinear distribution grooves 108 extend between a plurality of gas flow passages 110 and a central circular delivery groove 112. Each of the grooves 108 and 112 is generally semicircular in cross section and has a depth approximately equal to half the thickness of the lower section 80. Each of the gas flow passages 110 opens downwardly into shallow spider arm cavities 114.

With reference to FIGS. 3 and 6, the spider assembly 40 is described in more detail. The central hub 76 comprises a generally hollow cylindrical member having a vertical through bore extending from a lower surface 116 to an upper surface 118. The through bore comprises a lower shaft-receiving tapered portion 120, a central gas plenum 122, and an upper thermocouple channel 124. The lower tapered portion 120 receives the tapered upper end of the hollow drive shaft 36, the two elements having identical taper angles to fit snugly together. The thermocouple channel 124 receives the central thermocouple 72 which extends upward into the thermocouple cavity 104 in the upper section 78 of the segmented susceptor 42. The gas plenum 122 includes a plurality of apertures 126 aligned with each of the support arms 74. In this respect, the support arms are hollow, with an interior defining sweep gas passages 128. The upwardly directed terminal ends of the arms 74 are reinforced by annular lips 130. The lips 130 are sized to fit closely within the shallow arm-receiving cavities 114 in the underside of the lower section 80. The shaft 36 rotatably drives the spider assembly 40 which, in turn, drives the susceptor 42 by the registration between the lips 130 and the shallow cavities 114 in the underside of the lower section 80.

In an alternative embodiment, the curved arms of the spider assembly 40 may be replaced by a pair of perpendicularly disposed tubes. That is, for each of the three arms, a first tube may extend radially outward from the central hub 76 and couple with a second larger tube perpendicular thereto and extending upward to fit closely within the arm receiving cavities 114. This arrangement can be visualized somewhat like a corncob pipe. The first tubes of each arm may radiate horizontally from the hub 76 or may be slightly upwardly angled. Utilizing straight cylindrical sections, rather than a curved quartz tube, is less expensive to manufacture.

Referring back to FIG. 2, the spacers 100 may take several shapes. In one preferred embodiment, seen in detail in FIG. 2a, the spacer 100 is in the form of a pin comprising an elongated upper portion 132 having a rounded head. A base 134 sized larger than the elongated portion 132 fits within the counter-bored hole 98. The base 134 rests on the upper surface of the lower section 80. The heads of the elongated portions 132 of the multiple spacers 100 terminate at the same height to provide a planar support surface for the wafer 44. The upper portion of the counter-bored holes 98 is approximately 0.062 inches in diameter and the spacers 100 fit therein. The spacers 100 project into the recess 92, and thus support the wafer 44 over the floor of the recess, a height of between about 0.010 and 0.075 inches. In a preferred embodiment, the depth of the recess 92 and spacer 100 height is such that the top surface of the wafer 44 is in the plane of the outer ledge 84 to minimize any irregularity or transition and smooth gas flow thereover. Alternatively, the ledge 84 might be formed above or below the top of the wafer 44 as desired.

In an alternative embodiment, seen in FIG. 2b, the spacer 100 takes the form of a sphere 136 which fits within a cradle 138 formed in the upper surface of the upper section 78. The spacer 100 may even be formed integrally in the in upper section 78. Desirably, the upper wafer contacting portion of the spacer 100 is rounded or terminates in a point to effectively decouple conductive heat transfer to and from the wafer.

The fixed spacers 100 define a planar support platform or stand for the wafer 44 to space the wafer above the segmented susceptor 42, and in this respect at least three spacers are required, although more than three may be provided. Preferably, the spacers 100 are manufactured of a ceramic or naturally occurring or synthetically fabricated sapphire, sapphire being a single crystal structure derived from aluminum oxide. In an alternative configuration, the spacers 100 may be formed of amorphous quartz, although this material may eventually devitrify from the repeated thermal cycling within the reaction chamber 20. Further materials which may be used for the spacers include monocrystalline or single crystal quartz, boron carbide, aluminum nitride, and zirconium carbide, or other high-temperature resistant material capable of withstanding the extreme temperatures in the wafer processing chamber. Furthermore, any of these materials may additionally be coated with Si, $SiN_3$ or $SiO_2$ to protect the spacers from deterioration from exposure to process gases.

To prevent back-side contamination of the wafer 44 from reactant gases entering between the wafer and the susceptor 42, a novel sweep gas system is provided. More particularly and with reference to FIG. 2, the sweep gas enters the wafer support system through the hollow drive shaft 36 and into the plenum 122, as indicated with arrow 140. The gas is then distributed through the apertures 126 and into the sweep gas passages 128 within the arms 74. The gas continues in an inlet flow 142 into the gas flow passage 110 through the lower section 80. The distribution grooves 108 along with the lower surface of the upper section define gas channels between the upper and lower sections 78, 80. Referring to FIG. 5, the gas flows along the channels following the various distribution grooves 108 to finally reach the circular delivery groove 112, thereafter exiting through the sweep gas outlets 96, as indicated by arrow 144. The gas flow through the distribution grooves is shown by arrows 146. The gas flow into the delivery groove 112 is shown by arrows 148. The specific arrangement of the distribution grooves 108 may be different than that shown in FIG. 5. The arrangement shown helps reduce temperature nonuniformities through the lower section 80 and through the segmented susceptor 42 as a whole by channeling the sweep gas in a circuitous and symmetric path through the lower section. Desirably, the grooves 108 traverse a nonlinear path from the gas flow passages 110 to the central circular delivery groove 112 and sweep gas outlets 96.

The circular delivery groove 112 is formed directly underneath the circular pattern of sweep gas outlets 96. As seen in FIG. 4, the even distribution of gas through the groove 112 ensures that the sweep gas flow 148 leaving the outlets 96 is axisymmetric about the center of the susceptor 42 in a radially outward direction. In this manner, any reactant gas which might enter between the wafer and the susceptor is swept radially outward from underneath the wafer. Desirably, a flow rate of less than 5 standard liters/minute of sweep gas through the hollow shaft 36 and segmented susceptor is utilized, and a flow rate of less than 3 standard liters/minute is preferred. Although other gases may be substituted, hydrogen is preferred as it is compatible with many CVD processing regimes.

The present invention includes the mass flow controller 39 to regulate the flow of sweep gas through the hollow shaft 36 and segmented susceptor for different processing pressures. That is, some processes are at atmospheric pressure, and some are at reduced pressure. A reduced pressure process will tend to increase the flow of gas through the sweep gas outlets 96 as compared to an atmospheric process, all other variables remaining the same. Thus, the mass flow controller 39 operates independently from the process pressure to ensure a constant flow of less than 5 standard liters/minute.

FIGS. 7 and 8 illustrate another wafer support system 22' which utilizes some of the same elements as the wafer support system 22 shown in FIG. 2. More particularly, the spider assembly 40 and lower section 80 of the segmented susceptor 42' are identical to those shown and described with reference to the first embodiment. The segmented susceptor 42', however, includes a modified upper section 78', with an outer ring 82' comprising an upper ledge 84' and a lower skirt 86'. The upper ledge 84' is sized similar to the ledge 84 described with respect to the first embodiment and terminates in a circular step 88' leading to a circular recess 92'. The circular recess 92' extends radially outwardly past the lower section 80. In relative terms, the lower skirt 86' is substantially greater in the radial dimension in comparison to the skirt 86 described for the first embodiment, yet the step 90' is sized the same as the step 90 in the first embodiment. This allows the upper section 78 to receive the annular lower section 80 therein, just as in the first embodiment.

In a departure from the first embodiment, as seen in FIG. 7, the susceptor 42' includes a plurality of spacers in the form of support pins 150 circumferentially distributed about a circle around the central axis of the susceptor 42' in the region between the upper step 88' and the lower step 90'. More particularly, the pins 150 extend within stepped cavities 152, extending through the upper section 78' from the recess 92' to the extended skirt 86'. The pins 150 shown are somewhat different than the first two embodiments described with respect to FIGS. 2a and 2b, and comprise simple cylindrical elements having rounded heads in contact with the wafer 44'.

Figure 10:
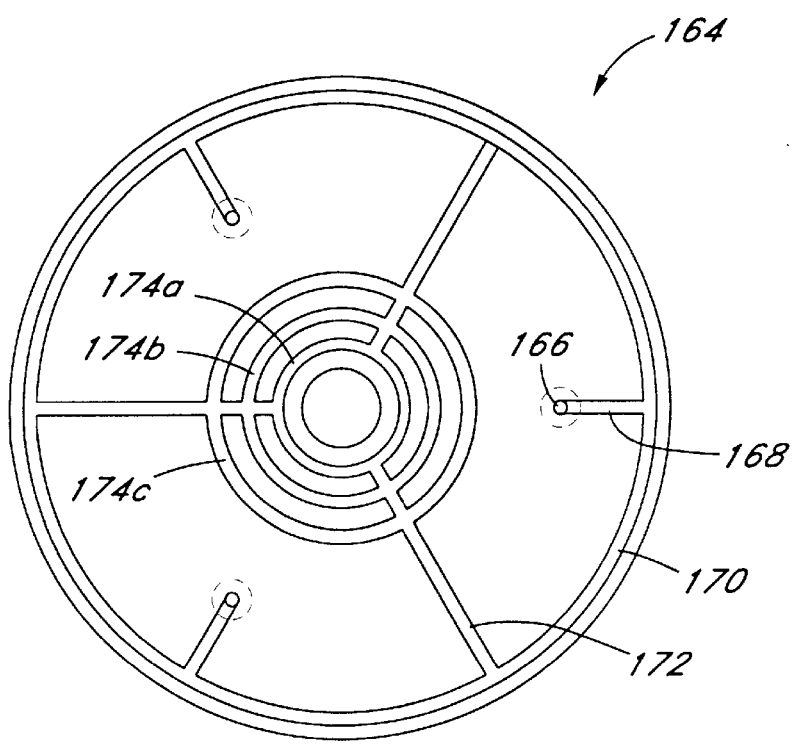
FIG. 10 is a top plan view of an alternative lower section of a segmented susceptor having multiple gas delivery grooves arranged in concentric circles.

An alternative embodiment of gas passage grooves through the susceptor is shown in FIGS. 9 and 10. As before, the spider assembly 40 supports a modified susceptor having an upper section 162 and a lower section 164. The lower section 164 includes three gas passages 166 opening downwardly to receive the upper ends of the spider assembly arms 74. In this respect, the locations of the sweep gas inputs are in the same location as with the first two susceptor embodiments 42 and 42'. From there, however, distribution grooves 168 in the upper surface of the lower section 164 extend radially outward to an outer circular groove 170. Secondary grooves 172 channel the sweep gas radially inward to intersect a series of concentric circular delivery grooves 174a, 174b and 174c located at spaced radii. Each secondary groove 172 preferably lies along a line which bisects the included angle defined between each pair of distribution grooves 168.

Looking at FIGS. 9 and 10, the upper section 162 includes a plurality of gas outlets arranged in a series of concentric circles corresponding to the circular delivery grooves 174a, 174b and 174c. More particularly, a first group of outlets 176a lie along an inner circle 178a at the same radius of the smallest delivery groove 174a. Likewise, two more groups of outlets 176b and 176c are arranged about outer concentric circles 178b and 178c, respectively, which correspond to the outer delivery grooves 174b and 174c.

Four outlets 176 are shown distributed evenly about each of the circles 178a,b,c, but more or less may be provided. Furthermore, the circumferential orientation of the outlets 176 may be staggered between the circles 178 as shown. With four outlets 176 per circle 178, each pattern of outlets is rotated 30° with respect to one of the other patterns. Alternatively, for example, eight outlets 176 per circle 178 evenly distributed and staggered would mean that each pattern of outlets is rotated 15° with respect to one of the other patterns. The staggering between patterns creates a more effective gas sweep under the wafer, as shown by arrows 180, than if the outlets 176 were aligned.

In another variation, the upper section 162 may be used with the lower section 80 described above with respect to FIGS. 3 and 5 as long as the inner circle 178a of outlets 176a aligns with the circular delivery groove 112. In that case, the outer circles 178b,c of outlets 176b,c would not be used. Additionally, the lower section 164 may be used with either of the above described upper sections 78, 78' as long as the inner delivery groove 174a aligns with the circular pattern of outlets 96, 96'. In that case, the outer delivery grooves 174b,c would not be used. Of course, other variations are contemplated.

The separation between the wafer 44 and the segmented susceptor 42, as well as the minimal direct support provided by the three spacers 100, effectively decouples the wafer and susceptor from heat conduction therebetween. The wafer 44 temperature is thus influenced primarily from radiant heat flux provided by the lamps surrounding the chamber. Also, some convective heat may be transferred by the sweep gas.

The spider assembly 40 is preferably constructed of quartz to provide a transparent support to the underside of the susceptor 42 to minimize the obstruction of radiant heat emitted from the lower heat lamps. Although quartz is preferred, other materials having a relatively high coefficient of radiant heat transmission may be utilized. To construct the spider assembly 40, the hub 76 is first machined into the proper shape. The tubular arms 74 are bent from straight portions and attached to the hub 76 by welding, for example. Heat treating and fire polishing reduce internal stresses in the quartz.

Figure 11:
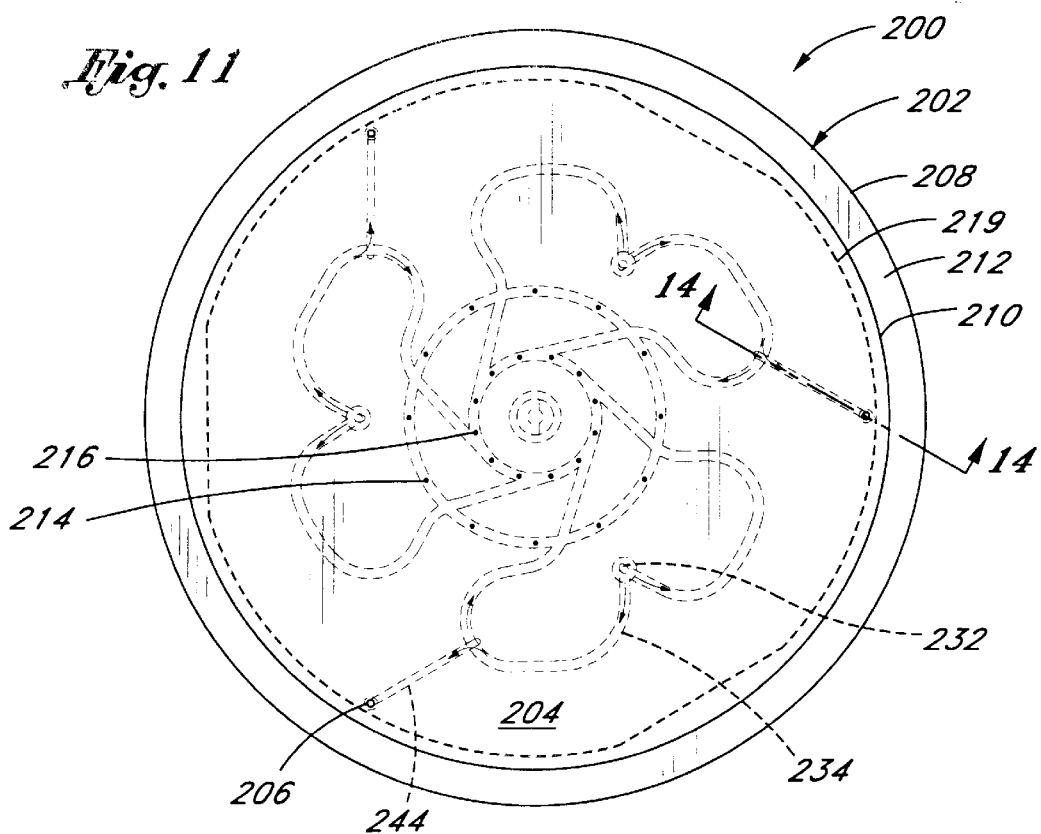
FIG. 11 is a top plan view of a preferred wafer support system of the present invention.

FIG. 11 illustrates a top plan view of a preferred wafer support system 200 of the present invention again comprising a segmented susceptor 202 having a concentric recess 204 in a top surface, and a plurality of wafer support spacers 206 positioned within the recess.

With reference FIG. 12 which illustrates a top section 208 of the segmented susceptor 202, the shallow recess 204 is defined around its outer perimeter by a circular step 210 leading to a ledge 212 which forms the uppermost surface of the susceptor. The construction is, in many respects, similar to the susceptors previously described.

In a departure from the previously described susceptors, the segmented susceptor 208 includes two concentric circles of sweep gas outlets. An outer circle of twelve sweep gas outlets 214 surrounds an inner circle of twelve sweep gas outlets 216. It can be readily seen from FIG. 12 that the outer sweep gas outlets are distributed about the center of the segmented susceptor 208 at intervals of 30°, or at 1:00, 2:00, etc. The inner circle of sweep gas outlets 216, on the other hand, are offset 15° rotationally with respect to the outer circle, and thus occupy rotational positions at 12:30, 1:30, etc., intermediate the outer circle of outlets. This increased number of sweep gas outlets and staggered relationship of the concentric circles increases the uniformity of sweep gas underneath the wafer and improves performance therefor; as was previously described with respect to FIG. 9.

Figure 14:
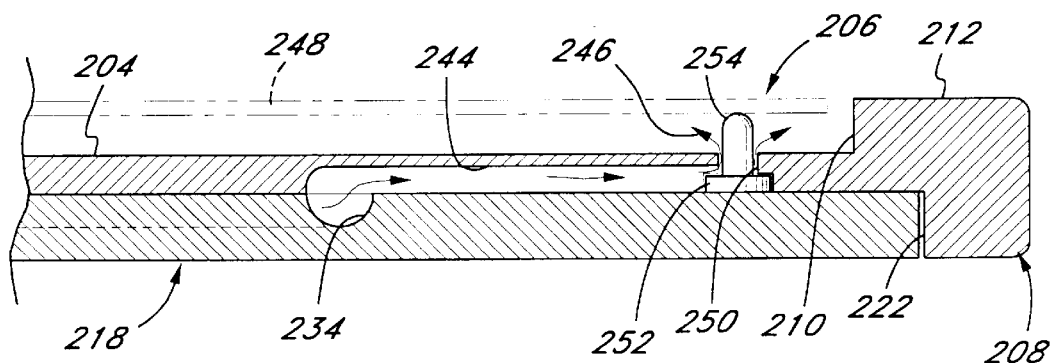
FIG. 14 is a cross-sectional view of a captured wafer spacer and purge channel within the segmented susceptor, taken along line 14—14 of FIG. 11.

FIG. 11 illustrates in dashed line, an interface 219 between the top section 208 and a bottom section 218 of the segmented susceptor 202, the bottom section being seen in top plan view in FIG. 13. The outer periphery of the bottom section 218 is substantially circular, except for three flats 220 disposed at 120° intervals therearound. The outer periphery of the bottom section 218 fits within a similarly shaped lower step 222 of the top section 208, as seen in dashed line in FIG. 12, and in cross-section in FIG. 14. The flats 220 of the bottom section 218 cooperate with inwardly-facing flats 224 formed in the lower step 222 to rotationally orient the top section 208 with the bottom section 218. The bottom section 218 further includes a small central through-bore 226 within which a downwardly depending hub or spindle 228 of the top section fits.

The underside of the bottom section 218 includes three shallow spider arm cavities 230, similar to those previously described. The cavities 230 communicate with vertical gas flow passages 232 leading to a plurality of gas distribution grooves 234 formed in the upper surface of the bottom susceptor section 218. As seen in FIG. 13, each gas flow passage 232 communicates with diverging grooves 234 which travel circuitous paths extending first radially outwardly, then circumferentially adjacent the periphery of the susceptor lower section, and finally generally radially inwardly toward the center of the bottom section 218. In this manner, sweep gas flows substantially through the entire susceptor in a generally axisymmetrical pattern to provide even heat transfer to the sweep gas from the hot susceptor, and visa versa.

Both gas distribution grooves 234 intersect a continuous outer circular delivery groove 236 concentrically formed in the bottom section 218. From the outer groove 236, a plurality of angled spokes 238 lead to an inner circular delivery groove 240, again concentrically formed in the bottom section 218. Although the gas distribution grooves 234 are shown continuing directly into each of the spokes 238, other arrangements are possible. Furthermore, the spokes 238 are shown intersecting the inner circular delivery groove 240 at generally tangential angles, but may also be connected at other more direct radial angles. The gas flow passages 232 are located radially outward from the sweep gas outlets 216 and the gas distribution grooves 234 desirably traverse a nonlinear path therebetween, preferably longer than a direct line between any of the passages 232 and outlets 216, and most preferably in a circuitous pattern such as the one shown.

The inner circular delivery groove 240 lies directly underneath the inner circle of sweep gas outlets 216 when the top section 208 is coupled over the bottom section 218. Likewise, the outer circular delivery groove 236 lies directly underneath the outer circle of sweep gas outlets 214. This arrangement allows for an even pressure and supply of sweep gas to all of the outlets 214, 216 in the top surface of the segmented susceptor 208. The pressure created between the top and bottom sections 208, 218, is reduced somewhat from previously described embodiments by the increase in the number of sweep gas outlets 214, 216, and by the reduction in size of the inlet gas flow passages 232. More specifically, the inlet gas flow passages 232 have a diameter of approximately 0.060 to 0.070 inches. FIG. 11 illustrates the gas flow from the passages 232 through the distribution grooves 234 with arrows 242.

In a departure from previous embodiments, and as seen in FIG. 12, each of the spacers 206 is supplied with purge gas from one of the gas distribution grooves 234 via a purge channel 244. These purge channels are seen in cross-section in FIG. 14 and extend from the respective gas distribution groove 234 directly to the spacer 206. In this manner, a continuous supply of purge flow, indicated at 246, is supplied to the regions surrounding each spacer 206. Each of the spacers 206 fits within an aperture 250 formed in the top surface of the recess 204. A clearance is provided between the spacer 206 and its aperture 250 so that the purge gas may flow upward therearound and protect the spacer from deposition gases. More particularly, when the wafer 248 is not present, the sweep gas through the outlets 214, 216 flows generally upward into the reaction chamber, rather than outward around each of the spacers. This leaves the spacers 206 unprotected from etch or capping gases. The spacer is defined by a lower cylindrical base 252 and upper elongated cylindrical pin 254 having a rounded upper surface. The pin portion 254 is undersized with respect to the aperture 250 to allow the purge flow 246 therethrough. In one embodiment, the pin 254 has a diameter of between 0.050 and 0.055 inches, while the aperture 250 has a diameter of between 0.062 and 0.067 inches.

The present invention provides a susceptor combination enabling selection of different upper sections depending on the wafer size to be processed. Such a combination is especially useful in the reaction chamber 20 having the support plate 32. As mentioned above, the susceptor preferably has a constant outer diameter to fit within the ring 62, and aperture 33 in the support plate 32. As the upper section defines the outer perimeter of the susceptor, it will by necessity have a constant diameter while the wafer recess varies in size to accommodate the different wafer sizes. The bottom shape of each of the upper sections is designed to mate with a single lower section, which reduces costs somewhat. FIGS. 11–17 illustrate four different susceptor combinations 200, 258, 278 and 300 for four different wafer sizes. Other sizes of wafers may of course be accommodated by such a combination, the maximum size only being limited by the outer diameter of the susceptor.

FIG. 15 illustrates a second version of a top section 260 of the wafer support system 200. The bottom section is the same as was described with respect to FIGS. 11–14. Indeed, an interface 262 between the top section 260 and the bottom section 218 is the same as previously described, and the gas distribution grooves 234 in the bottom section are in the same location. The top section 260 differs from the earlier described version by a reduced diameter recess 264. The recess 264 is defined by the circular step 266, which in turn creates a larger radial dimension for the ledge 268. The top section 260 is adapted to support smaller sized wafers within the recess 264. In this respect, a plurality of spacers 270 are positioned at 120° intervals around the center of the susceptor and at radial distances which provide adequate support for wafers of approximately 150 millimeters. To connect the purge gas grooves 234 with the spacers 270, shortened purge channels 272 are provided.

FIG. 16 illustrates a third version of a top section 280 of the wafer support system 200. Again, the bottom section is the same as before with the interface 282 between the top and bottom sections being the same. The top section 280 includes an enlarged ledge 284 terminating in a circular step 286. The recess 288 thus formed is sized to receive wafers of approximately 125 millimeters in diameter. Purge channels 290 lead to apertures surrounding the captured spacers 292 at radial dimensions sufficient to support the reduced-size wafers. It will be noted that the gas distribution grooves 234 extend radially outward from the recess 288, and then continue inward to the circular delivery grooves.

In a fourth version of the top section 302, seen in FIG. 17, the step 304 is even further moved inward, reducing the recess 306 to a size sufficient to support 100 millimeter wafers. Again, the interface 308 remains in the same location, as the bottom section of susceptor 300 is identical to that previously described. The outer ledge 310 is greatly enlarged in this embodiment. Three spacers 312 are provided at 120° intervals around the center of the susceptor, and three associated purge channels 314 connect the gas distribution grooves 234 thereto. It will be noted that the radial positions of the spacers 312 are within the circle created by the three gas inlet apertures in the bottom surface of the susceptor. Indeed, the gas distribution grooves 234 extend radially outward from the recess 306, and then continue inward to the circular delivery grooves. Furthermore, the location of the support arm-receiving cavities is just outside of the recess 306, and is thus outside of the wafer when positioned on the susceptor 300. The ledge 310 surrounding the recess 306 extends outward radially from the wafer for at least half the wafer diameter.

Although this invention has been described in terms of certain preferred embodiments, other embodiments that are apparent to those of ordinary skill in the art are also within the scope of this invention. For example, although some of the illustrated embodiments are described for specific sizes of wafers, the same features may also be used to accommodate even larger wafers. Indeed, wafers of 300 mm or larger are presently contemplated to supplement traditional 200 mm and smaller sized wafers.

What is claimed:

1. An apparatus for processing semiconductor wafers at elevated temperatures comprising:

a susceptor formed of at least two independent sections to be positioned in a high temperature processing chamber for supporting a wafer to be processed;

said susceptor including a substantially disc-shaped lower section and a substantially disc-shaped upper section having a lower surface in engagement with an upper surface of said lower section;

the engaging surfaces of said sections defining one or more gas channels therebetween;

a plurality of gas inlets in said lower section opening to its lower surface and said channels;

one or more gas outlets in said upper section opening to the upper surface of said upper section in an area beneath that in which a wafer to be processed is to be positioned, said outlets being open to said channels and thus connected to said inlets;

whereby when a wafer is placed on the susceptor and a gas is supplied through said plurality of gas inlets to said one or more gas channels and out said one or more gas outlets a flow of gas is provided under the water and out around the outer edge of the wafer; and a shaft in communication with the susceptor for rotating said shaft together with said susceptor.

2. The apparatus of claim 1, wherein one of said sections has an outer diameter larger than that of the other section, said larger section having a recess in which the other section is positioned.

3. The apparatus of claim 2, wherein said recess is formed in a lower surface of said upper section.

4. The apparatus of claim 1, wherein said channels are formed by grooves in the side of one of the sections facing the other section, with said grooves being closed by the other section.

5. The apparatus of claim 1, wherein there are three of said inlets each opening to said channels, said channels being interconnected to allow gas flow throughout.

6. The apparatus of claim 1, wherein said outlets are located in a central portion of said upper section and said inlets are located radially outward from the outlets, said channels having a length longer than the shortest possible distance extending between any of said inlets and said outlets.

7. The apparatus of claim 1, including a plurality of spacers which stably support the wafer to be processed protruding above the upper surface of said upper section to support a wafer slightly spaced from the upper section.

8. The apparatus of claim 7, including a recess in the upper surface of said upper section with a depth greater than the height of said spacers protruding above said upper surface so that the wafer to be positioned thereon fits within said upper recess and does not project substantially above a top surface of said susceptor.

9. The apparatus of claim 7, wherein said spacers have rounded upper ends to engage the lower surface of a wafer, with only minimal contact with the wafer.

10. The apparatus of claim 7, including apertures in said upper section for receiving and retaining said spacers, said apertures being sized slightly larger than said spacers to provide some clearance therebetween, and wherein some of said channels are at least partially defined by grooves in the lower surface of said upper section closed by the upper surface of said lower section, the grooves leading to said apertures to allow gas flow around said spacers.

11. The apparatus of claim 1, wherein there are at least three of said gas inlets in said lower section, with said gas inlets being symmetrically spaced around a center of the susceptor, and said gas inlets being adapted to receive tubular arms which support the susceptor and conducts gas into said inlets.

12. The apparatus of claim 1, including a support having at least three spaced arms having upper ends which engage said gas inlets, said arms being tubular so as to be able to conduct gas to said gas inlets.

13. The apparatus of claim 1, wherein said disc-shaped lower section and said disc-shaped upper section have engaging portions to prevent relative rotation therebetween.

14. An apparatus for processing a semiconductor wafer at an elevated temperature comprising:
   a substantially disc-shaped susceptor having gas channels formed therein with one or more gas inlets to said channels, said susceptor comprising two independent mating sections, with said channels being formed in the surface of one of said sections and enclosed by the other of said sections, said inlets open to a lower surface of said susceptor, said gas channels communicating with a plurality of gas outlets open to an upper surface of said susceptor; and
   a support for said susceptor including a central shaft and a plurality of support arms extending radially and upwardly from said shaft with the arms having upper ends adapted to engage the lower surface of said susceptor to support the susceptor, one or more of said arms being tubular so that gas may be conducted through said tubular arms into said inlets.

15. The apparatus of claim 14, wherein the upper ends of said support arms drivingly engage the lower surface of the susceptor so that rotation of the said shaft rotates said susceptor.

16. The apparatus of claim 14, wherein said gas inlets are located spaced outwardly from the center of the susceptor, and said gas outlets are located spaced radially outwardly from the center of the susceptor and radially inward from said gas inlets, and wherein said channels extend nonlinearly between said inlets and said outlets.

17. The apparatus of claim 16, wherein said channels extend outwardly from said inlets, continue circumferentially adjacent the periphery of the susceptor lower section and finally are directed radially inwardly to said gas outlets.

18. The apparatus of claim 14, wherein said mating sections comprise a substantially disc-shaped lower section and a substantially disc-shaped upper section having a lower surface in engagement with an upper surface of said lower section, said apparatus comprising:
   a plurality of spacers extending upwardly from the upper surface of said susceptor to support a wafer slightly spaced from the susceptor to permit gas from said outlets to flow beneath the wafer.

19. The apparatus of claim 18, comprising apertures in said upper section for receiving and retaining said spacers, said apertures being sized slightly larger than said spacers to provide some clearance therebetween, wherein some of said channels are formed in the lower surface of said upper section and lead to said apertures to allow gas flow around said spacers, and wherein some of said channels are formed by grooves in the upper surface of said lower section with said grooves being closed by the lower surface of said upper section the grooves leading to said outlets.

20. The apparatus of claim 18, wherein said susceptor upper surface has a shallow recess with a depth greater than the height of said spacers so that the wafer to be positioned thereon fits within said upper recess and does not project substantially above a top surface of said susceptor.

21. The apparatus of claim 14, including a plurality of spacers extending upwardly from the upper surface of said susceptor to support a wafer slightly spaced from the susceptor to permit gas from said outlets to flow beneath the wafer.

22. The apparatus of claim 21, including apertures in said susceptor for receiving and retaining said spacers, said apertures being sized slightly larger than said spacers to provide some clearance therebetween, and wherein some of said channels are in communication with said apertures to allow gas flow around said spacers.

23. An apparatus for supporting wafers in a semiconductor processing environment, comprising:
   a disc-shaped lower section; and
   a plurality of disc-shaped upper sections each adapted to register concentrically with said lower section, said upper sections each having an upper surface defining a shallow wafer recess sized differently than said other upper sections to enable selection of said upper section depending on the size of wafer to be processed, said upper sections each having substantially identical lower surfaces with lower recesses therein to receive an upper surface of said lower section wherein gas passages are defined between the surfaces for communicating gas from a lower surface of said lower section to said shallow wafer recess.

24. The apparatus of claim 23, wherein said lower section includes a plurality of cavities in a bottom surface for receiving arms of a susceptor support.

25. The apparatus of claim 23, including at least two upper sections for processing wafers having diameters greater than 100 mm.

26. The apparatus of claim 25, including an upper section for processing a wafer having a diameter of 100 mm.

27. The apparatus of claim 23, including a plurality of spacers adapted to fit within apertures in said upper sections and project into said recess for supporting wafers over said susceptor.

28. The apparatus of claim 27, wherein said gas passages are in communication with said spacers apertures for introducing sweep gas around said spacers and between said susceptor and said wafers.

29. An apparatus for processing a semiconductor wafers at an elevated temperature comprising:
   a substantially disc-shaped susceptor having one or more gas inlets;
   a plurality of spacers extending upwardly from an upper surface of said susceptor to support a wafer slightly spaced from the susceptor and permit gas to flow beneath the wafer;

generally horizontal channels formed between independent mating sections of said susceptor, said horizontal channels communicating gas from said inlets to regions above said susceptor; and a plurality of quartz arms supporting said susceptor spaced above a chamber floor.

30. The apparatus of claim 29, wherein said spacers are made of a different material than said susceptor.

31. The apparatus of claim 30, wherein said spacers are made of sapphire.

32. The apparatus of claim 30, wherein said spacers are made of a high temperature resistant material and coated with $Si$, $SiO_2$, or $SiN_3$.

33. An apparatus for processing a semiconductor wafers at an elevated temperature comprising:

a substantially disc-shaped susceptor having a recess in a top surface for receiving wafers to be processed gas channels formed in said susceptor with a plurality of gas inlets in said susceptor to said channels, and one or more gas outlets open to said recess, wherein said gas inlets and said gas outlets are located spaced radially outwardly from the center of the susceptor, said gas outlets being located radially inward from said gas inlets, and wherein said channels extend nonlinearly between said inlets and said outlets.

34. An apparatus for processing semiconductor wafers at elevated temperatures comprising:

a susceptor to be rotatably positioned in a high temperature processing chamber for supporting a wafer to be processed;

said susceptor including first and second sections, the first section having an outer diameter larger than that of the second section, and said first section having a recess in which the second section is positioned, said sections when assembled being rotationally locked with respect to each other;

one or more gas channels defined by engaging surfaces of said sections;

one or more gas inlets in said second section opening to its lower surface and said channels; and one or more gas outlets in said first section opening to said channels and to the upper surface of said first section.

* * * * *